(12) United States Patent
Van Der Tempel (10) Patent No.: US 11,709,238 B2
(45) Date of Patent: *Jul. 25, 2023

(54) DEMODULATOR WITH A CARRIER GENERATING PINNED PHOTODIODE AND A METHOD FOR OPERATING IT

(71) Applicant: Sony Depthsensing Solutions SA/NV, Brussels (BE)

(72) Inventor: Ward Van Der Tempel, Muizen (BE)

(73) Assignee: Sony Depthsensing Solutions SA/NV, Brussels (BE)

(*) Notice: Subject to any disclaimer, the term of this patent is extended or adjusted under 35 U.S.C. 154(b) by 0 days.

This patent is subject to a terminal disclaimer.

(21) Appl. No.: 17/464,454

(22) Filed: Sep. 1, 2021

(65) Prior Publication Data

US 2022/0082674 A1 Mar. 17, 2022

Related U.S. Application Data

(63) Continuation of application No. 16/323,076, filed as application No. PCT/EP2017/070517 on Aug. 11, 2017, now Pat. No. 11,131,758.

(30) Foreign Application Priority Data

Aug. 12, 2016 (EP) .................... 16184045

(51) Int. Cl.
*H01L 27/146* (2006.01)
*G01S 7/4913* (2020.01)

(52) U.S. Cl.
CPC ........ *G01S 7/4913* (2013.01); *H01L 27/1461* (2013.01); *H01L 27/1463* (2013.01); *H01L 27/14614* (2013.01); *H01L 27/14643* (2013.01)

(58) Field of Classification Search
CPC ................. H01L 27/1463; H01L 27/1461
See application file for complete search history.

(56) References Cited

U.S. PATENT DOCUMENTS

| | | | |
|---|---|---|---|
| 11,131,758 B2 * | 9/2021 | Van Der Tempel | ........................ H01L 27/1463 |
| 2008/0246063 A1 | 10/2008 | Liu | |
| 2009/0224139 A1 | 9/2009 | Buettgen et al. | |
| 2012/0074496 A1 | 3/2012 | Jalilizeinalij | |
| 2012/0193743 A1 | 8/2012 | Kawahito et al. | |

(Continued)

FOREIGN PATENT DOCUMENTS

| | | |
|---|---|---|
| CN | 1795561 A | 6/2006 |
| CN | 102208428 A | 10/2011 |

(Continued)

OTHER PUBLICATIONS

International Search Report and Written Opinion for International Application No. PCT/EP2017/070517 dated Nov. 24, 2017.

(Continued)

*Primary Examiner* — Thanh Luu
(74) *Attorney, Agent, or Firm* — Wolf, Greenfield & Sacks, P.C.

(57) ABSTRACT

The disclosure relates to a demodulator including a pinned photodiode; at least one storage node; at least one transfer gate connected between the storage node and the pinned photodiode. The pinned photodiode includes a p-doped epitaxial semiconductor layer; a n-doped semiconductor region formed within the epitaxial semiconductor layer; a p+ pinning layer formed on top of said semiconductor region. The pinning layer is split into at least two separate regions spaced apart by electrical insulating element, each region being arranged for being biased independently by a respective biasing signal for creating a gradient of potential within the semiconductor region.

16 Claims, 10 Drawing Sheets (56) References Cited

U.S. PATENT DOCUMENTS

2015/0286078 A1   10/2015  Cho
2019/0187260 A1    6/2019  Van Der Tempel

FOREIGN PATENT DOCUMENTS

| CN | 102484681 A | 5/2012 |
|---|---|---|
| CN | 102867834 A | 1/2013 |
| CN | 104009050 A | 8/2014 |
| CN | 104916655 A | 9/2015 |
| CN | 109804267 A | 5/2019 |
| EP | 1885000 A2 | 2/2008 |
| EP | 2759848 A1 | 7/2014 |
| IN | 7124CHENP2013 A | 8/2014 |

OTHER PUBLICATIONS

Chen et al., A 256x256 time-of-flight image sensor based on center-tap demodulation pixel structure. Science China Information Sciences. Apr. 2016;59:042409. DOI: 10.1007/s11432-015-5453-0. 10 pages.

Kim et al., A CMOS Image Sensor Based on Unified Pixel Architecture with Time-Division Multiplexing Scheme for Color and Depth Image Acquisition. IEEE Journal of Solid-State Circuits. Nov. 2012;47(11):2834-45.

Takeshita et al., High-speed charge transfer pinned-photodiode for a CMOS time-of-flight range image sensor. Proceedings of SPIE. Jan. 2010;7536. DOI: 10.1117/12.846277. 10 pages.

Tubert et al., High Speed Dual Port Pinned-photodiode for Time-Of-Flight Imaging. 2009 International Image Sensor Workshop (IISW). Jun. 1, 2009. 3 pages.

\* cited by examiner

DEMODULATOR WITH A CARRIER GENERATING PINNED PHOTODIODE AND A METHOD FOR OPERATING IT

CROSS-REFERENCE TO RELATED APPLICATIONS

The present application claims the benefit under 35 U.S.C. § 120 as a continuation application of U.S. application Ser. No. 16/323,076, filed on Feb. 4, 2019, now U.S. Pat. No. 11,131,758, which claims the benefit under 35 U.S.C. § 371 as a U.S. National Stage Entry of International Application No. PCT/EP2017/070517, filed in the European Patent Office as a Receiving Office on Aug. 11, 2017, which claims priority to European Patent Application Number EP 16184045.9, filed in the European Patent Office on Aug. 12, 2016, each of which applications is hereby incorporated by reference in its entirety.

BACKGROUND

Field of the Disclosure

The present disclosure relates to a demodulator for receiving a light signal as a modulation signal en an electric signal as a demodulation signal, and to a method for operating it. One of the applications of interest is the Time-Of-Flight measurement.

Description of the Related Art

Computer vision is a growing research field that includes methods for acquiring, processing, analyzing and understanding images. The main driving idea in that field is to duplicate the abilities of human vision by electronically perceiving and understanding images of a scene. Notably, one theme of research in computer vision is the depth perception or, in other words, the three-dimensional (3-D) vision.

Time-Of-Flight (TOF) camera systems appeared recently and are capable of capturing 3-D images of a scene by timing the interval between emission and echo-return of a measurement signal. This approach is based on the principle that, for a signal with a known propagation speed in a given medium, the distance to be measured is given by the product of the propagation speed by the time the signal spends to travel back and forth. Such TOF camera systems are used in many applications where depth or distance information from a fixed point is required.

TOF measurements are often based on phase-shift measurements. In this approach, the propagation time interval is determined by means of a phase comparison between the emitted and the received light signal. Such phase comparison requires synchronization of a demodulation signal with the emitted light signal.

Figure 1:
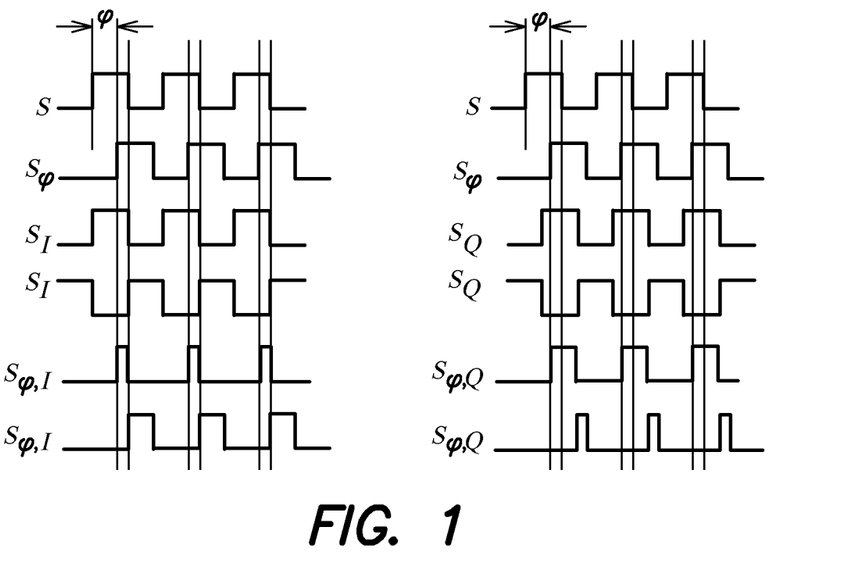
FIG. 1 illustrates an example of signals used to determine correlation measurements in a TOF camera, in related art.

The computation of the phase-shift $\varphi$ can be done as follows. A photodetected signal $S_\varphi$ is usually correlated, or demodulated, with electrical reference signals, i.e. demodulation signals, named $S_I$, $S_{\overline{I}}$, $S_Q$ and $S_{\overline{Q}}$. $S_I$, $S_{\overline{I}}$, $S_Q$ and $S_{\overline{Q}}$ are shifted by 0°, 180°, 90° and 270° respectively, compared to the original optical signal S, as illustrated in FIG. 1. The correlation signals obtained are defined as:

$$S_{\varphi,I} = S_\varphi \cdot S_I$$

$$S_{\varphi,\overline{I}} = S_\varphi \cdot S_{\overline{I}}$$

$$S_{\varphi,Q} = S_\varphi \cdot S_Q$$

$$S_{\varphi,\overline{Q}} = S_\varphi \cdot S_{\overline{Q}}.$$ (eq. 1-4)

Then, two parameters I and Q are calculated such that:

$$I = A_S \cdot \alpha \cdot (S_{\varphi,I} - S_{\varphi,\overline{I}}) \text{ and}$$

$$Q = A_S \cdot \alpha \cdot (S_{\varphi,Q} - S_{\varphi,\overline{Q}}).$$ (eq. 5-6)

$A_S$ and $\alpha$ are, respectively, the amplitude change of the photodetected signal $S_\varphi$ and the efficiency of the correlation. The extraction of $\varphi$ depends on the shape of the modulation signal S. For example, if S is a sine wave, then $$\varphi = \begin{cases} \arctan\frac{Q}{I} & \text{if } I, Q \geq 0 \\ \arctan\frac{Q}{I} + \pi & \text{if } I < 0 \\ \arctan\frac{Q}{I} + 2\pi & \text{if } Q < 0, I \geq 0 \end{cases}$$ (eq. 7-9)

Once the phase $\varphi$ is known, the distance $D_\varphi$ of objects from camera can be retrieved thanks to the following formula:

$$D_\varphi = \frac{c \cdot (\varphi + 2\pi \cdot n)}{4\pi \cdot f_{mod}}$$ (eq. 10)

where $f_{mod}$ is the modulation frequency and n is a integer number of ℕ.

Figure 2A:
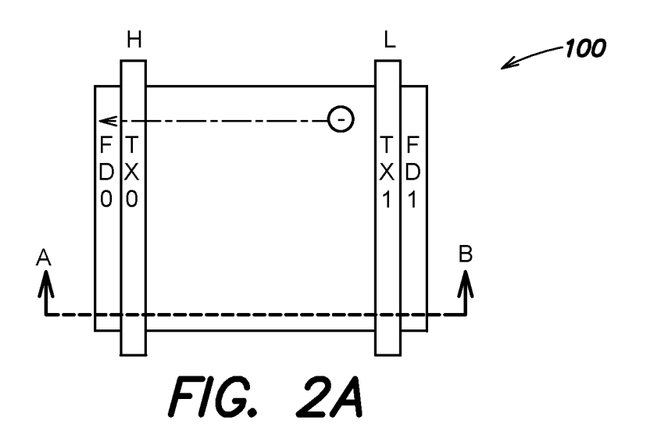
FIG. 2*a*) is a top-view of a related art demodulator and FIG. 2*b*) is a cross-section of the demodulator along the line A-B of FIG. 2*a*).
Figure 2B:
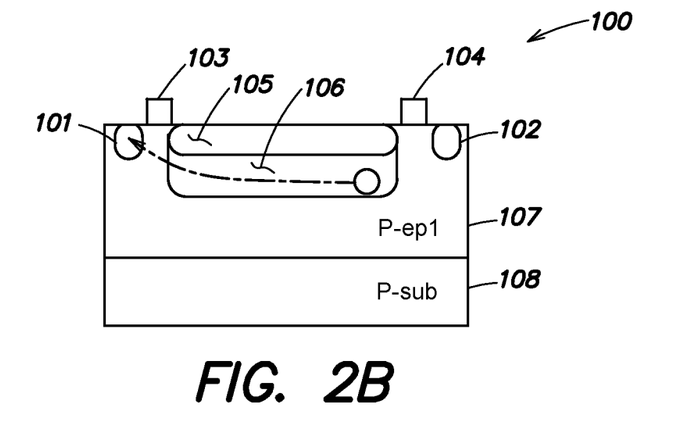

In related art, the correlation, also called the demodulation, can be performed using several types of devices. For instance, the correlation can be performed by a demodulator 100 as represented by FIGS. 2 *a*, *b*). FIG. 2*a*) is a top-view of the demodulator 100 and FIG. 2*b*) is a cross-section of the demodulator 100 along the line A-B of FIG. 2*a*).

The demodulator 100 comprises a pinned photodiode. The pinned photodiode is a buried-diode structure with a buried n-well 106 sandwiched between a epitaxial p-type layer P-epi 107 and a p+ cap layer 105 also called pinning layer. The epitaxial layer 107 can also be formed above a P-substrate 108.

The demodulator 100 also comprises transfer gates 103, 104, also designated TX0, TX1, respectively, and storage sites 101, 102. The storage sites 101, 102 are Floating Diffusion nodes FD0, FD1, respectively, electrically isolated from all other nodes. They are quasi-neutral regions with a potential determined exclusively by the amount of charge stored in them, and their capacitance. Capacitance of this region is usually very low, to achieve high conversion gain, i.e. the change of the ratio potential/voltage with the addition of one electron. The storage sites 101, 102 and transfer gates 103, 104 are formed within or above the epitaxial p-layer 107, respectively.

The demodulator 100 performs the demodulation as follows. During an exposure time T, the transfer gates TX0, TX1 are driven with demodulation signals as explained above. Electron-holes pairs are formed within the pinned photodiode and generated minority carriers, here electrons, are transferred to a FD node thanks to the demodulation signal, via a diffusion phenomenon. In FIG. 2, the carrier transfer is towards FD0, since the transfer gate TX0 is high and the transfer gate TX1 is low. The number of electrons stored is proportional to the overlapping duration of the demodulation signal and the reflected light signal, performing thereby the desired correlation.

Figure 3:
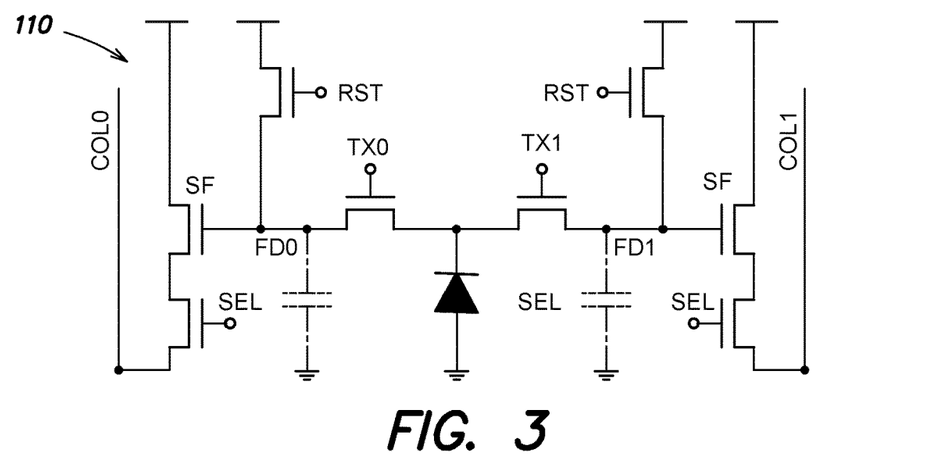
FIG. 3 illustrates an example of related art demodulation pixel.

Several components are added to the demodulator to form a demodulation pixel 110, as represented in FIG. 3. Before the readout, the floating diffusion nodes FD0, FD1 are reset by reset transistors RST. During the readout, the electrons accumulated in the photodiode are transferred to the floating diffusion nodes FD0, FD1 by opening transfer gates TX0, TX1, respectively. The voltage at the floating diffusion nodes FD0, FD1 changes and this change is amplified by the source follower transistors SF and read out thanks to the selection transistors SEL.

Figure 4:
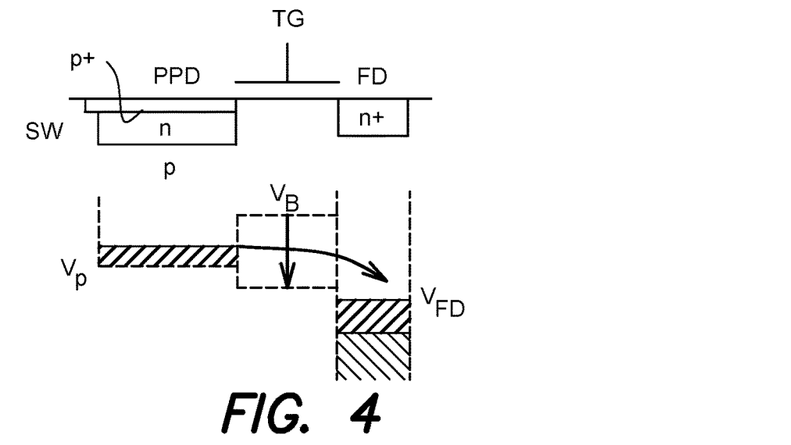
FIG. 4 illustrates an example of monotonic potential barrier within a related art demodulator.

In theory, the fact of using a pinned photodiode enables to overcome several issues. With a pinned photodiode, the n-well is normally fully depleted with application of a sufficient transfer gate voltage. Indeed, as illustrated in FIG. 4, the potential in the pinned photodiode has a maximum in the n-region with a value called the pinning potential $V_p$. Between the pinned photodiode and the Floating Diffusion node FD is a minimum potential or barrier potential VB controlled by the transfer gate TG. There is a monotonic increase in potential from the n-well to the FD node which allows complete transfer of all carriers from the n-well to the FD node. In theory, lag is thus eliminated. Since it is a buried photodiode, dark current is also suppressed.

Figure 5:
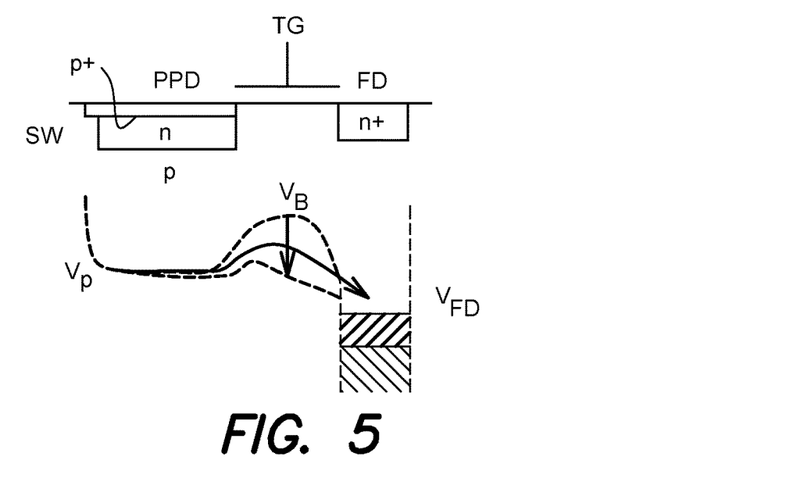
FIG. 5 illustrates an example of non-monotonic potential barrier within a related art demodulator.

In practice, if the potential between the n-well and the FD node does not increase monotonically, there exists a barrier to charge transfer and some carriers may never be removed even after long transfer times, as shown in FIG. 5. This barrier may lead to lag and noise.

Moreover, for large pixels with "flat" potentials in the n-well, the transfer of carriers is limited by the diffusion and the time for a complete transfer can start to become significant. For instance, for a pixel with a pitch of 5.6 µm, the average transfer time is 12 nsec but with a pitch of 40 µm, it grows to 600 nsec.

Figure 6A:
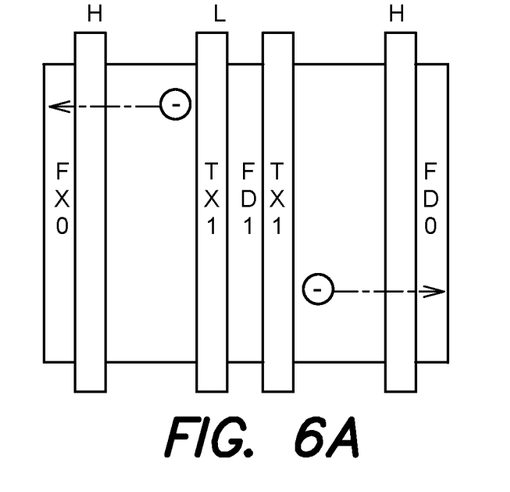
Figure 6B:
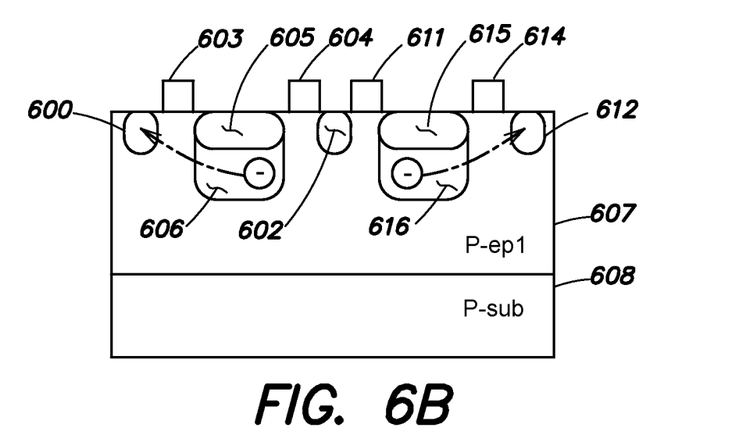
Figure 6C:
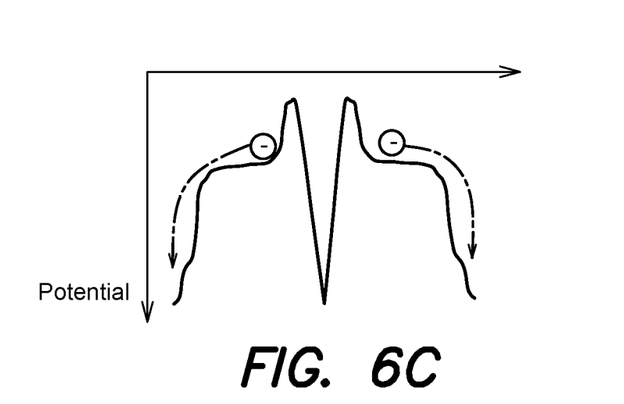

In related art, a split pinned photodiode structure has been implemented in the article by Kim et al. "A CMOS Image sensor based on unified pixel architecture with Time-Division Multiplexing scheme for color and depth image acquisition" (IEEE Journal of solid state circuits, vol. 47, No. 11, November 2012) and is represented in FIGS. 6 *a-c*. In order to achieve a better transfer of charge, a standard pinned photodiode as described herein above is split into two small pieces with a doubled number of Floating Diffusion nodes 600, 602, 612. The travel distance of generated electrons is thus decreased, and the charge transfer faster. Indeed, as shown in FIG. 6*c*), the potential in the depletion region is slightly bent, generating a lateral electric field to boost the transfer speed by drift.

The above split pinned photodiode has a lower sensitivity than the normal pinned photodiode because the size of the detection region is decreased and the number of FD nodes doubled. The optical area is also reduced and, as a consequence, the fill factor of this split structure is also lower than the one of the standard pinned photodiode. In fact, the above arrangement is just equivalent to two demodulators sharing a Floating Diffusion node. A balance between transfer charge speed and fill factor is thus required.

A solution remains thus to be proposed for implementing an efficient demodulator with a pinned photodiode demonstrating a good sensitivity, a fast transfer of charges and a high fill factor.

SUMMARY

The present disclosure relates to a demodulator according to claim 1 and to a method for operating it according to claim 14.

Actually, the one skilled in the art names the device of the instant case a demodulator. However, this device acts more as a correlator.

Thanks to the disclosure, a gradient of potential is created by the biasing signal applied to the separate region. The potential barrier seen by the minority carriers decreases and the transfer of charges from the semiconductor region towards the storage nodes can be performed faster. The present disclosure enables to combine both diffusion and drift mechanism to ensure a faster transfer of charges towards the storage nodes and avoid lag and noise issues.

Preferably, the separate regions of the pinning layer are biased with demodulation signals, while the associated transfer gates are biased with the same demodulation signal or with a Direct Current signal for improving the demodulation speed.

Preferably, a lateral photodiode is formed within the demodulator. Thanks to this lateral photodiode, a compromise is found between the demodulation speed and the fill factor. The distance between the pinned photodiode and the storage nodes being small, a high demodulation speed can be achieved. At the same time, a high Quantum Efficiency, a high fill factor and a high sensitivity are also obtained, since the charge carriers are generated within a large area thanks to the laterally extending depletion areas.

Advantageously, the semiconductor region and the pinning layer extend laterally for increasing the surface of the depletion area.

The extended semiconductor region and pinning layer can have a tentacle type shape and form a plurality of tentacles laterally extending and tapering outwardly from a central region of the pinning layer towards said boundary.

This particular tentacle shape creates a strong gradient from the tip of the tentacles to the central region which enables to capture and channel a large amount of generated minority carriers towards the central region. The recombination rate of carriers before transfer is thus highly reduced.

Thanks to this embodiment of the disclosure, the surface of the central region of the pinning diode can now be very small for improving the demodulation speed.

More advantageously, the demodulator of the present disclosure is used for Time-Of-Flight measurements. By choosing, for instance, counter-phased demodulation signals for the transfer gates, it is possible to perform efficient and consistent correlation measurements.

Other advantages and novel features of the disclosure will become more apparent from the following detailed description when taken in conjunction with the accompanying drawings.

BRIEF DESCRIPTION OF THE DRAWINGS

FIGS. 6 *a-c* illustrate a split pinned photodiode structure as implemented in related art, FIG. 6*a*) being a top view of said structure, FIG. 6*b*) its cross-section and FIG. 6*c*) representing the potential barrier within said structure;

FIG. 7 *a*) is a cross-section of a demodulator according to the disclosure;

FIG. 8 a) is a cross-section of a demodulator according to the disclosure;

DESCRIPTION OF THE EMBODIMENTS

In the following, the present disclosure will be presented with respect to a demodulator formed within a p-doped semiconductor layer. It should be understood that the one skilled in the art could easily implement the demodulator of the disclosure within a n-doped semiconductor layer by exchanging the doping type of the different elements forming the demodulator.

Figure 7A:
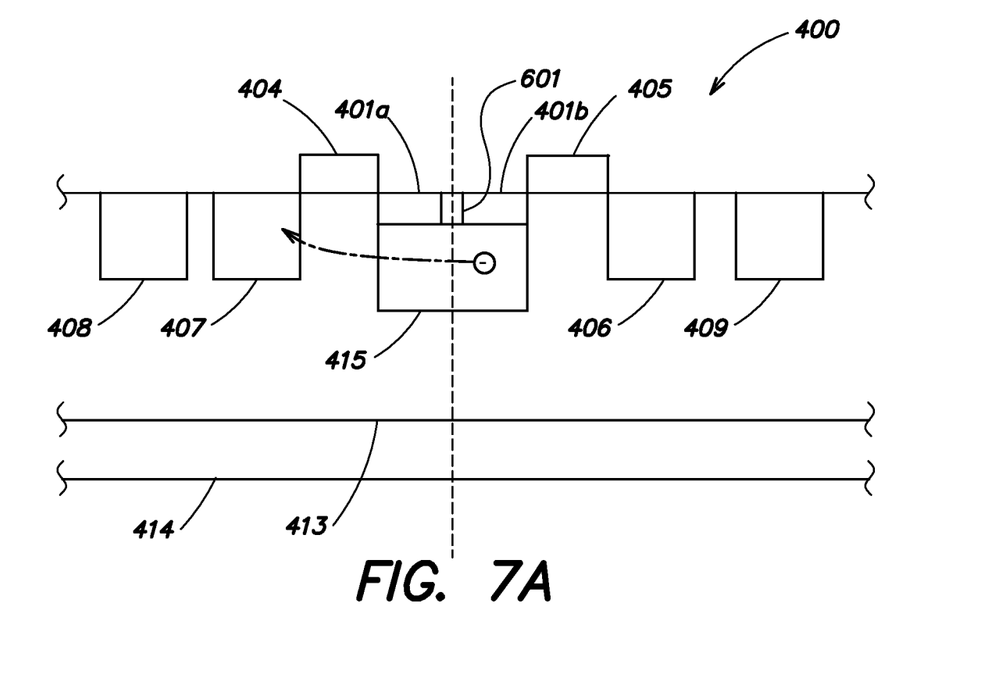
Figure 8A:
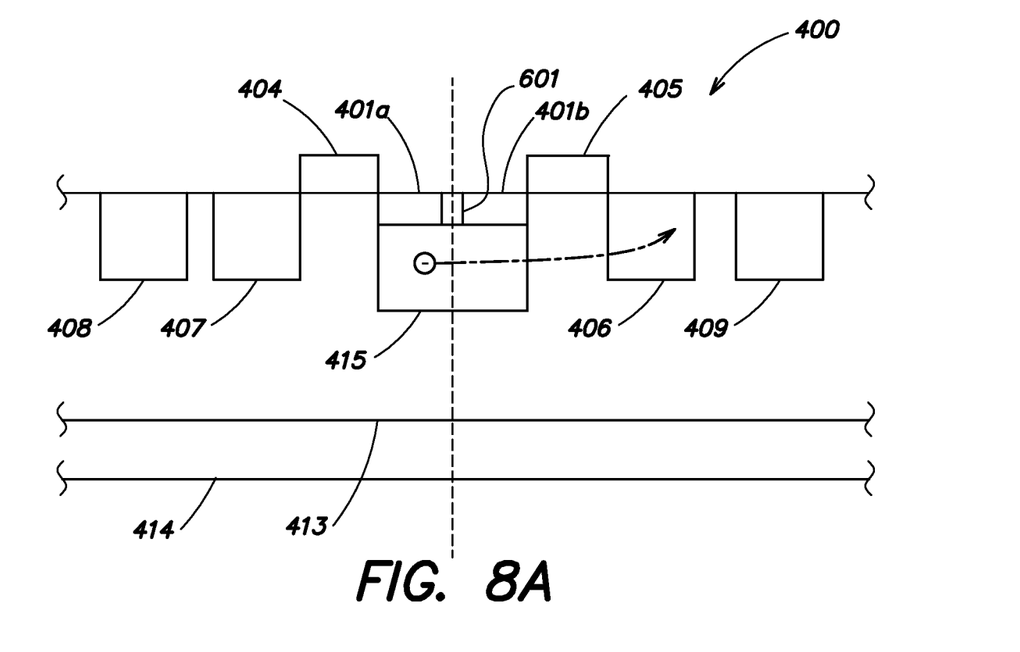

Cross sectional views of a demodulator 400 according to the disclosure are represented in FIGS. 7 a) and 8 a).

The demodulator 400 of the present disclosure comprises:
  a pinned photodiode for generating majority and minority carriers in response to an incident modulation signal. When the demodulator 400 is used for Time-Of-Flight measurement, this modulation signal is a modulated light reflected from a scene of interest.
  at least one storage node 406, 407 for storing the minority carriers generated by the pinned photodiode. Two storages nodes are represented in FIGS. 7a) and 8a) but the disclosure is not limited thereto. The storage node can be for instance Floating Diffusion nodes.
  at least one transfer gate 404, 405 connected between the storage node 406, 407 and the pinned photodiode and driven by a transfer signal for transferring the minority carriers generated by the pinned photodiode towards the storage node. Two transfer gates are represented in FIGS. 7a) and 8a) but the disclosure is not limited thereto. The transfer mechanism of the carriers once inside the photodiode is normally diffusion, but, as it will be explained latter, the disclosure enables to obtain a further transfer by drift. The transfer signal can be a demodulation signal or a Direct Current signal, as it will be explained later.

The pinned photodiode of the demodulator 400 comprises:
  an epitaxial semiconductor layer 413 doped with a first dopant (p for instance) of a first conductivity type. This epitaxial layer 413 is preferably lightly doped or an intrinsic semiconductor. This epitaxial layer 413 can be formed above a semiconductor substrate 414 for instance, doped with a dopant (p in the present case) of the first conductivity type.
  a semiconductor region 415 doped with a second dopant (n for instance) of a second conductivity type, opposite to the first conductivity type, formed within the epitaxial semiconductor layer 413. This semiconductor region 415 is preferably an n-well deeply implanted within the epitaxial semiconductor region 413.
  a pinning layer 401 doped with a third dopant (p+ for instance) of the first conductivity type formed on top of said semiconductor region (415); Preferably, this pinning layer 401 is highly doped and forms an ohmic contact. The third dopant might distinguish over the first one just by its concentration.

The storage nodes 406, 407 are formed within the epitaxial semiconductor layer 413 and the transfer gates 404, 405 are formed on top of the epitaxial semiconductor layer 413.

The pinning layer 401 of the demodulator 400 of the disclosure is split into at least two separate regions 401a, 401b spaced apart by electrical insulating element 601. Each region 401a, 401b is arranged for being biased independently by a respective biasing signal for creating a gradient of potential within the semiconductor region 415.

Indeed, the working of the pinned photodiode is based on the principle that the semiconductor region 415, preferably a well, can be fully depleted. The resulting potential in the photodiode is the pinning voltage $v_p$. In prior art, this potential is referred to 'ground', meaning the potential of the pinning layer 401, typically biased to ground, and the potential of the epitaxial layer 413, also typically biased to ground, are equal. If one moves the complete potential system, moving the reference voltages on the pinning layer 401 and the voltage of the epitaxial layer 413, the pinning potential $v_p$ will also move. This implies that if the pinning layer 401 is biased to a different potential than ground, the pinning voltage inside the semiconductor region 415 will change as well.

The disclosure uses this behaviour to create a potential gradient inside the semiconductor region 415, by referring one part of the semiconductor region 415 to a first pinning layer 401a with a first biasing signal Va and by referring a second part of the semiconductor region 415 to a second pinning layer 401b with a second biasing signal Vb. The pinning layers 401a and 401b can for instance be separated by an STI region (shallow trench isolation) or the regions 401a and 401b can be isolated by junction isolation. The regions 401a and 4001b can also be shorted while still applying different biasing signals, creating power dissipation in the pinning layer 401, 401a, 401b while creating a smooth voltage gradient throughout the pinning layer between the contact regions where the different voltages are applied in the pinning layer. This embodiment is possible and has the benefit of a smooth gradient in the pinning layer but at the cost of power consumption.

Figure 7B:
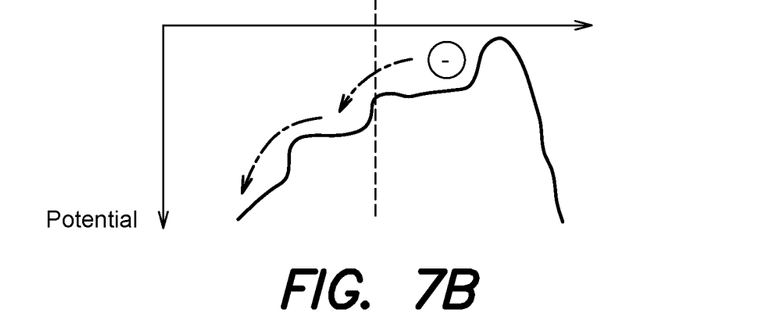
FIG. 7b) represents the potential barrier within the structure of FIG. 7a) under first bias conditions.
Figure 8B:
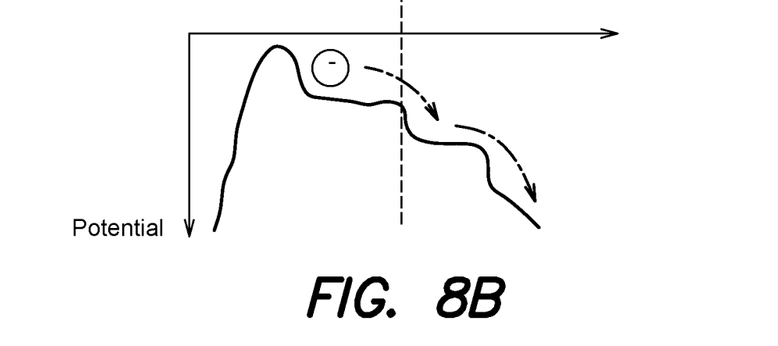
FIG. 8b) represents the potential barrier within the structure of FIG. 8a) under second bias conditions.

By modulating the voltages Va and Vb, for example in counter-phase as it will be explained later, a modulated potential gradient can be created in the pinned photodiode. As a result the minority carriers gathered in the well 415 will now move through drift to the transfer gate 404, 405 where the potential gradient is pointing to. Potential diagrams within the demodulator 400 of the disclosure are represented in FIGS. 7b) and 8b), showing said gradients of potential and the associated movement of the carriers, under different bias conditions. For example, gradient of potential may be from voltages of substantially 1.1V (at 415) to voltage of substantially 2.2V to 2.5V (at 406, 407). During the transfer, the blocked transfer gate's (405) voltage is set at, for example, substantially 0V, while the active transfer gate voltage (404) is set at substantially 3.0V The separate regions 401a, 401b can be driven by demodulation signals, Va and Vb, preferably counter-phased demodulation signals, while the transfer gates are in pass and are driven with transfer signals being Direct Current signals. The potential gradient in the semiconductor region 415 is created by a difference in bias Va and Vb and defines to which transfer gate 404, 405 and respective storage node 407, 406 the minority carriers are transported.

Preferably, each separate region 401a, 401b of the pinning layer 401 is associated with a respective transfer gate 404, 405. The separate region and its associated transfer gate are then driven together with the same demodulation signal to enhance the modulation. If the demodulator comprises two separate regions 401a, 401b and two transfer gates 404, 405, a first demodulation signal can drive the first association 401a, 404 while a second demodulation can drive the second association 401b, 405, the second demodulation signal being in counter-phase with respect to the first demodulation signal. This enables to perform correlation measurements, as explained above.

In one embodiment, the transfer gates are not implemented and the storage nodes 405, 406 are connected to the photodiode by default. The demodulation signals on the pinning layers 401a, 401b create a potential gradient which defines to which storage node the gathered minority carriers in the well 415 will drift allowing modulation or demodulation of the carriers.

Figure 9:
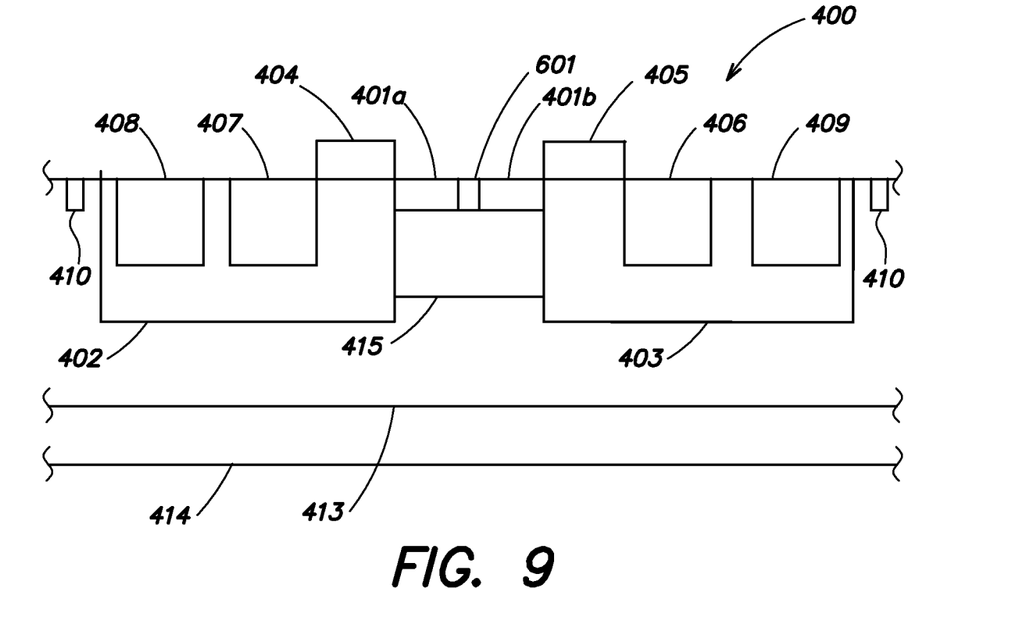
FIG. 9 is a cross-section of a demodulator according to an embodiment of the disclosure.
Figure 10:
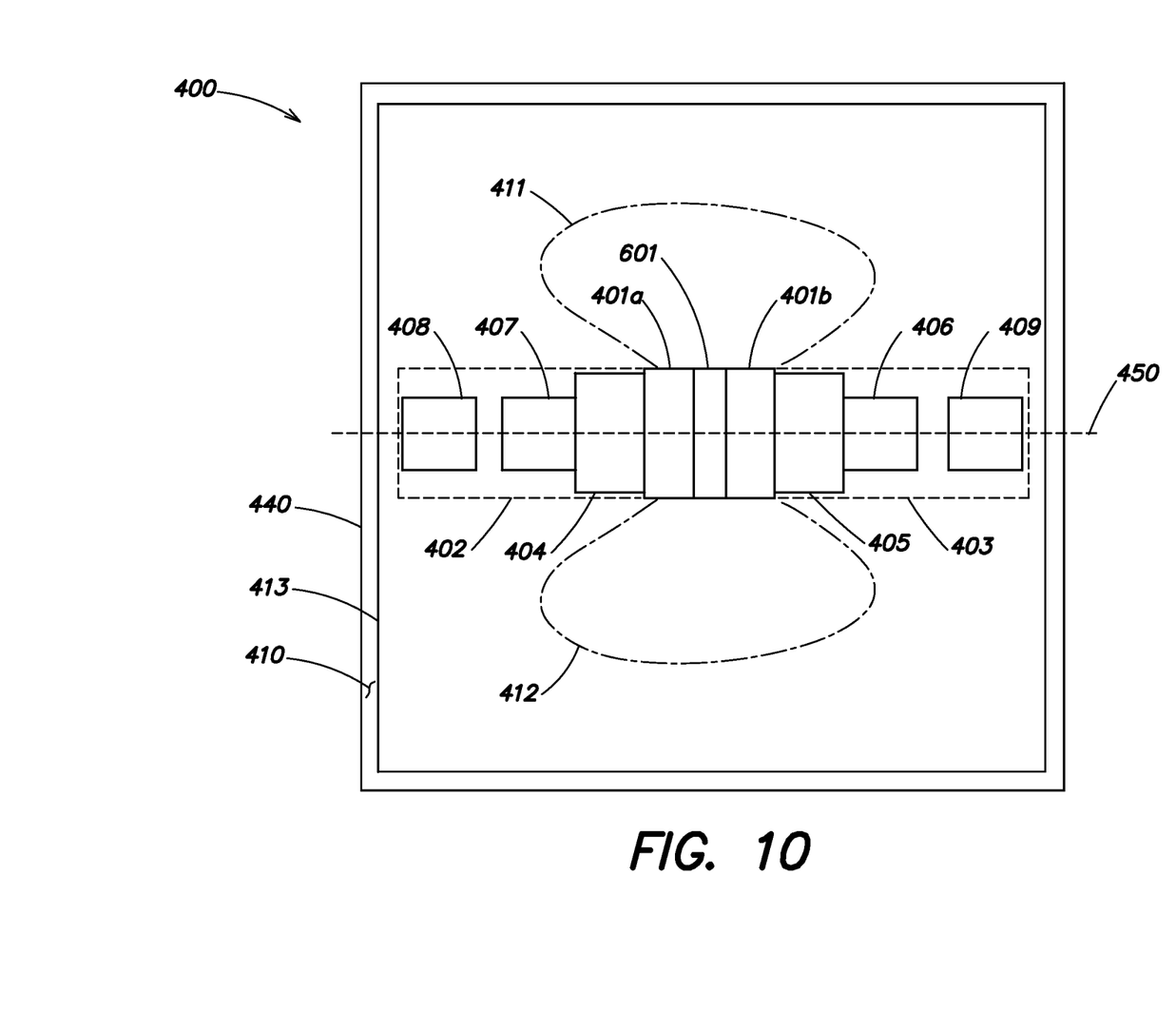
FIG. 10 is a top view of the demodulator of FIG. 9.
Figure 11:
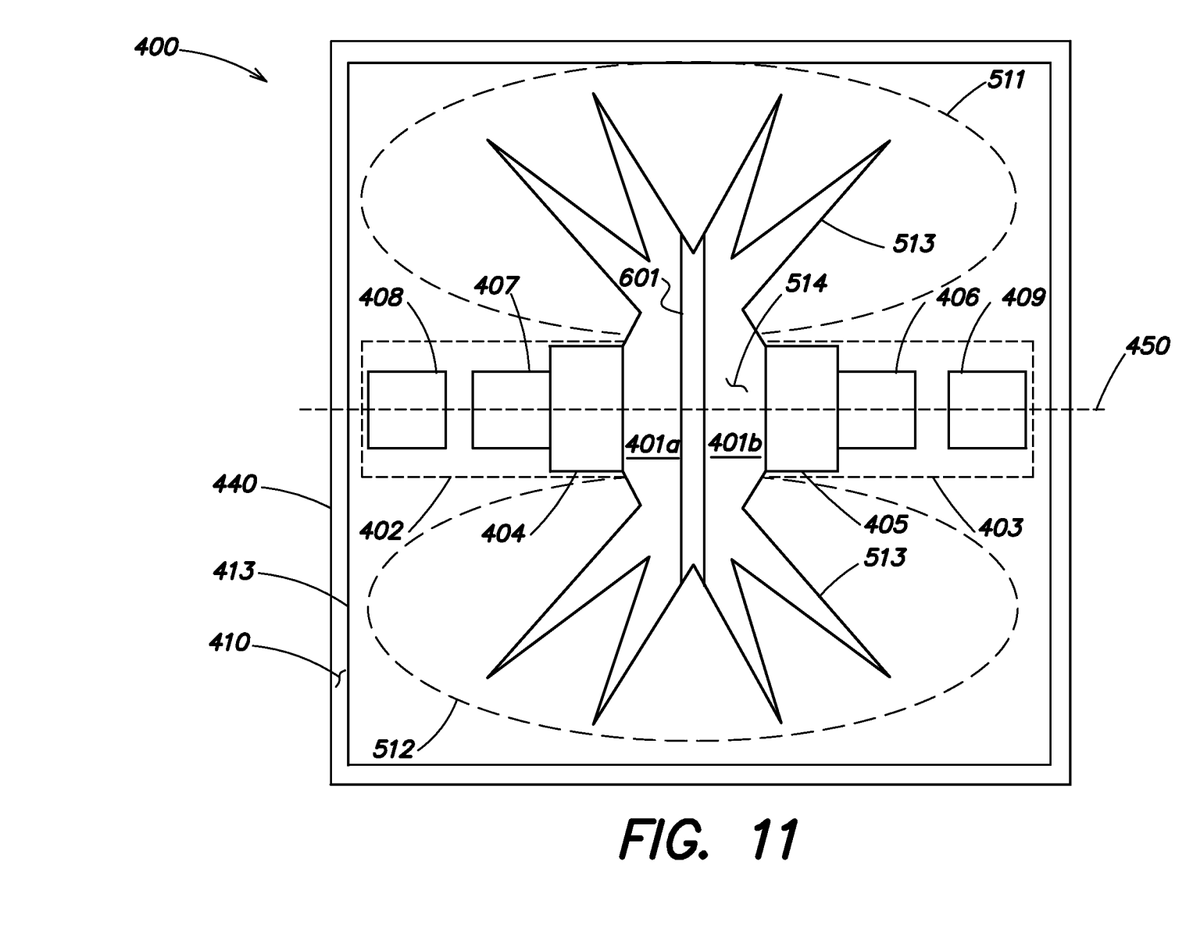
FIG. 11 is a top view of a demodulator according to a further embodiment of the disclosure.

Further embodiments of the demodulator 400 of the present disclosure are represented in FIGS. 9-11. FIG. 9 is a cross-section of a demodulator 400 according to an embodiment of the disclosure. FIG. 10 is a top view of the demodulator 400 of FIG. 9.

According to an embodiment of the disclosure, a lower junction and at least one lateral junction substantially perpendicular to the lower junction are formed at the interface of the semiconductor region 415 with the epitaxial semiconductor layer 413 and the demodulator 400 further comprises generating means for generating minority and majority carriers at said lateral junction and for forming a lateral photodiode. It should be understood that the semiconductor region 415 comprises a bottom wall and lateral sides walls. By lateral, it should be understood that said lateral side walls are not parallel to the bottom wall and are substantially perpendicular to the bottom wall. The bottom junction is formed at the interface between the bottom wall and the epitaxial semiconductor layer 413 whereas the lateral junctions are formed at the interface between said lateral side walls and the epitaxial semiconductor layer 413.

The generating means can comprise for instance a well 402, 403 of the first conductivity type (p for instance) formed within the epitaxial semiconductor layer 413. The at least one transfer gate 404, 405 and storage node 406, 407 are formed within said well 402, 403. The at least one transfer gate 404, 405 and storage node 406, 407 are encapsulated by said well 402, 403 as it is important to isolate the storage node from the epitaxial semiconductor layer. This isolation could also have been performed another way, for example by using isolation based on a buried oxide. The well 402, 403 contacts the semiconductor region 415. The epitaxial semiconductor layer 413 is an intrinsic semiconductor.

The doping of the epitaxial semiconductor layer 413 and the doping of the well 402, 403 are preferably adapted for forming at least one depletion area 411, 412 extending laterally within the epitaxial semiconductor layer 413. This depletion area is allowed to form laterally as the epitaxial intrinsic semiconductor layer 413 is much lower doped than the well 402, 403. For example the epitaxial layer 413 may be doped from $1E11/cm^3$ to $1E14/cm^3$, typically at substantially $1E12/cm^3$, while photodiode well 402, 403 may typically be doped between $1E15$ and $1E17/cm^3$, typically at substantially $1E16/cm^3$.

Indeed, a depletion region formed at the interface of a standard p-n junction is not symmetrically split between the n and p regions, it will extend towards the lightly doped side. In the present disclosure, because the epitaxial semiconductor layer 413 is intrinsic, a large depletion area 411, 412 is formed laterally, corresponding to the lateral junction n-doped semiconductor region 415/intrinsic p semiconductor layer 413. Because of the p-well 402, 403, the depletion area 401, 402 cannot extend between the storage node 406, 407, the transfer gate 404, 405 and the semiconductor region 415. This means that most of the minority carriers collected within the pinned photodiode originates from the lateral depletion area 411, 412.

The semiconductor layer 413 can comprise a boundary 440 and, preferably, can further comprise a semiconductor implant 410 doped with a fourth dopant (p+ for instance) of the first conductivity type formed on top of said semiconductor layer 413, disposed along said boundary 44, for forming a lateral P-I-N photodiode. This implant enables to achieve a better pixel-to-pixel isolation and to obtain a better sensitivity. It should be pointed out that, in FIGS. 10 and 11, the boundary 440 is square-shaped, but any geometrical shape could be implemented.

A further embodiment of the demodulator 400 of the disclosure is represented in FIG. 11.

With the lateral photodiode presented above, the depletion areas do not extend close to the boundary 440, or close to the semiconductor implant 410. This means that the efficiency of the photodiode is not optimized. To overcome this issue, as represented in FIG. 11, the semiconductor region 415 and the pinning layer 401a, 401b extend laterally for increasing the surface of the depletion area 511, 512. This surface increase can be noticed when comparing the surfaces of depletion areas 511, 512 of FIG. 11 with the ones of depletion areas 411, 412 of FIG. 10.

The extended semiconductor region 415 and pinning layer 401a, 401b have a tentacle type shape and form a plurality of tentacles 513 laterally extending and tapering outwardly from a central region 514 of the pinning layer 401 towards said boundary 440.

This particular tentacle (or star) shape creates a potential gradient within from the tip of the tentacles 513 to the central region 514 which enables to capture and transfer faster the collected minority carriers towards the central region 514 where the modulation happens.

Thanks to the disclosure, the surface of the central region 514 can now be very small, preferably lower than a surface of the depletion area 511, 512. The central region 514 of the pinning layer 401a, 401b is defined by the surface of the virtual intersection of the pinning layer 401a, 401b with a virtual region connecting the transfer gates 404, 405.

Preferably, the storage node 406, 407, the transfer gate 404, 405 and the central region 514 of the pinning layer 401a, 401b are disposed along a central line 450 and the depletion area 511, 512 laterally extends on both sides of said central line 450.

The demodulator 400 could also comprises pixel circuitry 408, 409 formed within a well 402, 403 of the first conductivity type (for instance p here), said well being formed within the epitaxial semiconductor layer 413, as represented in FIG. 9. This well can be the same as the one of the generating unit or a different one. The pixel circuitry 408, 409 could also be implemented directly within the epitaxial semiconductor layer 413 as represented in FIGS. 7a) and 8a), when the embodiment of the lateral photodiode is not implemented.

It should be pointed out that any embodiment of the demodulator presented above could be used use in Time-Of-Flight (TOF) applications. By choosing, for instance, counter-phased demodulation signals for the transfer gates, it is possible to perform consistent correlation measurements based on TOF measurements, as explained in the preamble part of the description.

Figure 12:
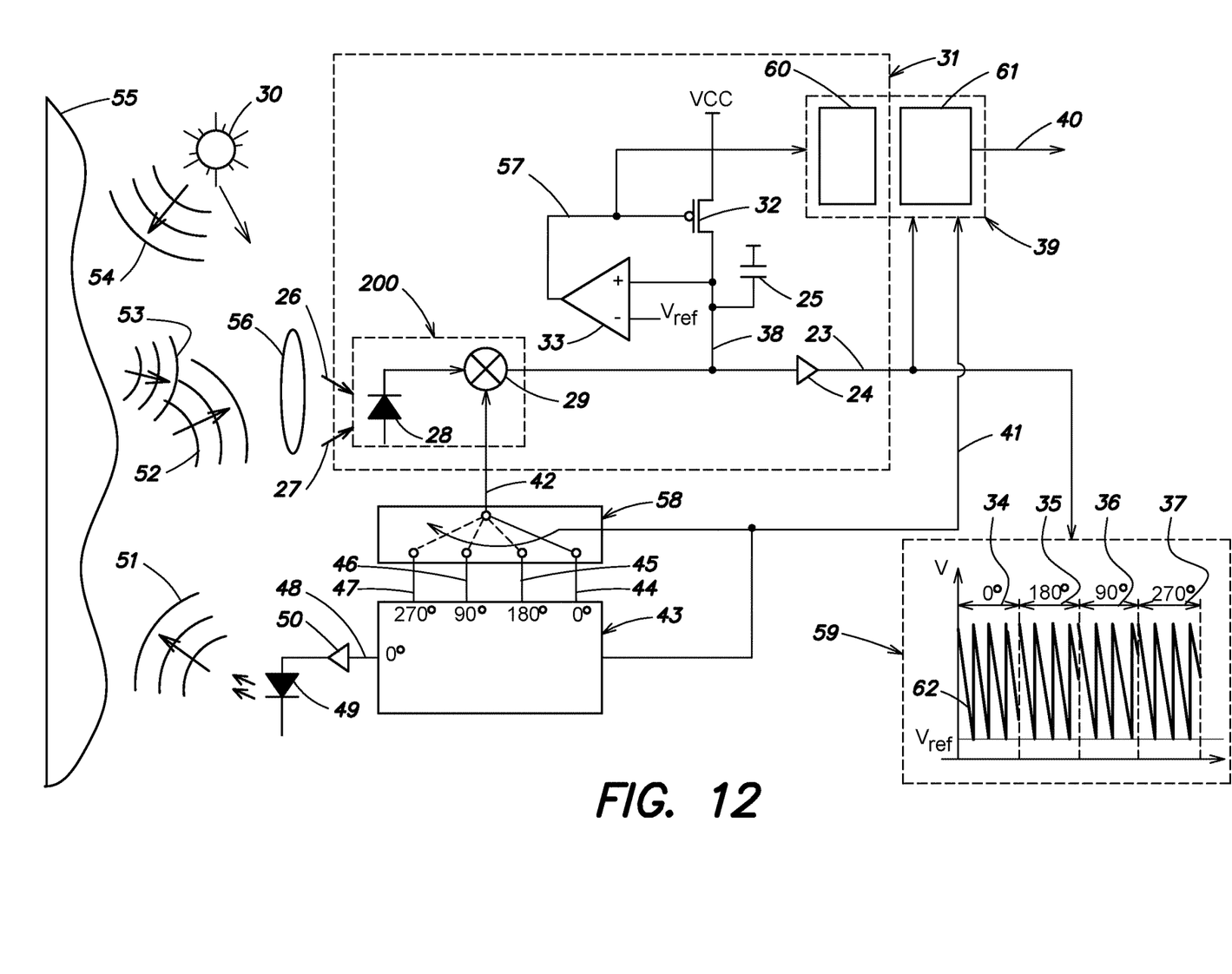
FIG. 12 schematically shows an implementation of a TOF sensor according to an embodiment of the present disclosure.

FIG. 12 shows an embodiment of a range finding system according to the present disclosure. The range finding system includes a light source 49 for emitting light 51 onto a scene 55, preferably focused onto an area of interest, where the light is reflected. The range finding system further includes at least one pixel 31 for receiving reflected light. In order for the light source 49 to emit modulated light, a signal generator 43 is provided. The signal generator 43 generates a first clock signal or modulation signal on node 48 that is preferably permanently oscillating at a predetermined frequency, e.g. at about 10 MHz. This signal generator 43 also generates second to fifth clock signals which are delivered onto nodes 44, 45, 46, 47, respectively, having a 0°, 180°, 90° and 270° phase relation with the first clock signal on node 48. A person skilled in the art can also consider using other or more clock phases in the operation scheme, more clock phases leading towards better measurement precision in exchange for a longer measurement time. Alternatively, instead of modulating by means of phases of a clock signal, a person skilled in the art can also consider transmitting a pseudo-random bit stream and mixing with a set of delayed and/or inverted same pseudo random bit streams. The use of pseudo-random bit streams, sometimes referred to as pseudo-noise is known in literature by a person skilled in the art. In that case, instead of the first and second clock signals it is advised to use a pseudo-random pattern, instead of the third clock signal use the same pseudo-random pattern but bitwise inverted and instead of the fourth clock signal, the same pseudo random pattern but delayed by a bit period and instead of the fifth clock signal, the same pseudo-random pattern but inverted and delayed by a bit period.

The signal generator 43 also generates a control signal 41 that is determining for a modulation signal alteration means to change the modulation signal, e.g. a control signal 41 that is determining for a selector 58 to select between the second to fifth clock signals, i.e. between the different phases of the clock signal. Selector 58 is switching sequentially between these four phases connecting the input node 42 of a mixer 29 of a detector and mixer stage 200 with the second to fifth clock signals on nodes 44, 45, 46 and 47 sequentially. At each of these positions selector 58 can stay connected for a relaxation period of e.g. about 1 ms.

Buffer 50 drives the light source 49 that emits its light 51 onto the scene 55, preferably focused on the area of interest. Part of this light will be reflected, thus generating reflected light 52. This reflected light 52 then arrives on an optical focusing system such as a lens 56, through which it is imaged or focused on a detector 28 inside pixel 31, where the incident fraction is called the reflected modulated light (ML) 27.

Indirect light 53 and direct light 54, both originating from secondary light sources 30 not intended for the TOF measurement, will also be present in the scene, impinge on the optical focusing system 56 and thus be focused on the detector 28. The part of this light entering detector 28 will be called background light (BL) 26. Light sources 30 generating BL include incandescent lamps, TL-lamps, sunlight, daylight, or whatever other light that is present on the scene and does not emanate from the light source 49 for TOF measurement. An aim of the present disclosure is to obtain valid TOF measurements even in the presence of the signal from BL 26.

ML 27 and BL 26 impinge onto the photodetector 28, and generate, respectively, an ML-current and a BL-current, which are photo-induced current responses to the impinging BL 26 and ML 27. Detector 28 outputs these currents to a subsequent mixing means, e.g. mixer 29, for mixing the current responses to the impinging BL 26 and ML 27 with the phase-shifted clock signal on input node 42. As already stated earlier, this BL 26 can induce a BL-current of up to 6 orders of magnitude higher than the ML-current induced by the ML 27 received for TOF measurements.

Detector 28 and mixer 29, forming detector and mixer stage 200, can as well be implemented as one single device, for example as described in EP1513202A1, where the photo-generated charges are mixed generating the mixing product current at once.

The detector and mixer stage 200 will generate the mixing products of the current responses to the impinging BL 26 and ML 27 with phase-shifted clock signals, and these signals are being integrated on node 38 by means of an integrator, for example implemented with a capacitor 25, which preferably is kept small, e.g. the parasitic capacitance of the surrounding transistors. During integration, an automatic reset of the mixer output signal on the integrator node 38 is performed.

This may for example be implemented by a comparator 33 triggering a reset switch, e.g. reset transistor 32, so that the mixer output signal on node 38 is automatically reset whenever it reaches a reference value Vref, thus avoiding saturation.

In alternative embodiments, not illustrated in the drawings, the automatic reset of the mixer output signal on the integrator node 38 can be implemented in several other ways. One of them is triggering a charge pump, instead of the reset switch 32, to add a fixed amount of charges to capacitor 25 yielding a better noise performance at the cost of some more complexity.

The mixing products forming the mixer output signal are available in a sequential form synchronised with the modulation signal alteration means, in the example illustrated selector 58, at integrator node 38. An output driver 24, e.g. a buffer, provides a voltage gain substantially 1 and current amplification so as to provide a stronger output signal at output node 23.

In graph 59 an example of an output signal at node 23 is represented. Curve 62 corresponds to the voltage evolution versus time of the output signal at output node 23. It is supposed that the average BL contribution 26 and average ML 27 is constant during acquisition.

During a first relaxation period 34, selector 58 is connected to node 44. The mixing of the incoming signal from the detector 28 (responses to BL 26 and ML 27) is done with the second clock signal at node 44, which is a 0° shifted version of the first clock signal driving the light source 49. The mixer output signal at node 38 will thus be determined by a BL component and a 0° mixed ML output. The next relaxation period 35 starts by connection of input node 42 to node 45 through selector 58. From then on, the mixer 29 is driven 180° out of phase. Therefore its output will be determined by the same BL component and a 180° mixed output. The phases 90° and 270° are subsequently treated similarly in subsequent relaxation periods 36 and 37 respectively.

Time-of-flight data reconstruction block 39 uses the output signal at output node 23 to measure, e.g. by taking samples, the end values of each relaxation period 34, 35, 36, 37, also called phase interval. This data is grouped to TOF pairs, e.g. (0°, 180°) and (90°, 270°). TOF data reconstruction block 39 serves to translate the bare pixel signals to useful time-of-flight output 40.

Figure 13:
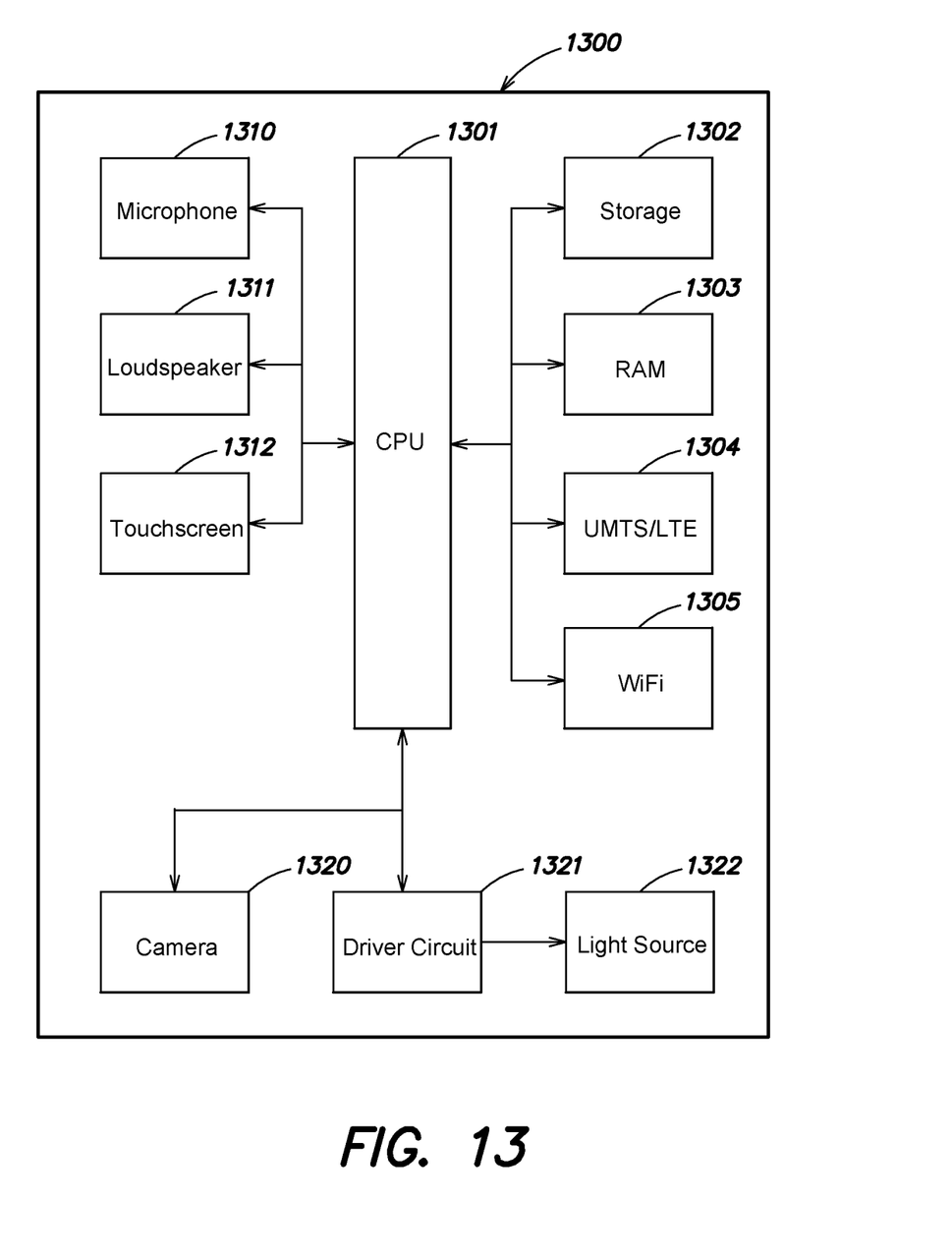
FIG. 13 schematically describes in more detail an embodiment of an electronic device that may be used in context of the embodiments.

FIG. 13 schematically describes in more detail an embodiment of an electronic device 1300 that may be used in context of the embodiments. The electronic device 1300 includes a CPU 1301 as processor. The electronic device 1300 further includes a microphone 1310, a loudspeaker 1311, and a touchscreen 1312 that are connected to the processor 1301. These units 1310, 1311, 1312 act as a man-machine interface and enable a dialogue between a user and the electronic device. The electronic device 1300 further includes an interface for a telecommunication (e.g UMTS/LTE interface) 1304 and an interface for a wireless LAN (e.g. WiFi-interface) 1305. These units 1304, 1305 act as I/O interfaces for data communication with external devices such as companion devices, servers, or cloud platforms. The electronic device 1300 further includes an image sensor 1320 that is arranged to obtain compressed sensing image data. Image sensor 1320 may in particular relate to a Time-of-Flight camera technique. The electronic device 1300 further comprises a driver circuitry 1321 to drive a light source 1322, e.g. for distance range-finding with at least one predetermined pulse frequency. The electronic device 1300 further includes a data storage 1302 (e.g. a Hard Drive, Solid State Drive, or SD card) and a data memory 1303 (e.g. a RAM). The data memory 1303 is arranged to temporarily store or cache data or computer instructions for processing by processor 1301. The data storage 1302 is arranged as a long term storage, e.g. for recording image sensor data obtained from the image sensor 1320.

It should be noted that the description above is only an example configuration. Alternative configurations may be implemented with additional or other sensors, storage devices, interfaces or the like. For example, in alternative embodiments, UMTS/LTE interface 1304, WiFi interface 1305, microphone 1310, touchscreen 1312, and/or loudspeaker 1311 may be omitted or replaced by other units. Likewise, touchscreen 1312 may for example be replaced by a display device that is not touch sensitive.

Note that the present technology can also be configured as described below.

(1) A demodulator including:
  a pinned photodiode configured to generate majority and minority carriers in response to an incident modulation signal;
  at least one storage node configured to store the minority carriers generated by the pinned photodiode;
  at least one transfer gate connected between the storage node and the pinned photodiode and arranged for being driven by a transfer signal for transferring the minority carriers generated by the pinned photodiode towards the storage node;
the pinned photodiode including:
  an epitaxial semiconductor layer doped with a first dopant (p, n) of a first conductivity type;
  a semiconductor region doped with a second dopant (n, p) of a second conductivity type opposite to the first conductivity type, formed within the epitaxial semiconductor layer; and
  a pinning layer highly doped with a third dopant (p+, n+) of the first conductivity type formed on top of the semiconductor region, the pinning layer being split into at least two separate regions spaced apart by electrical insulating element, each region being arranged for being biased independently by a respective biasing signal for creating a gradient of potential within the semiconductor region.

(2) The demodulator of (1), wherein the electrical insulating element includes a Shallow Trench Isolation.

(3) The demodulator of (1) or (2), wherein at least one of the biasing signals is a demodulation signal.

(4) The demodulator of (3), wherein the transfer signal is a Direct Current signal or said demodulation signal.

(5) The demodulator of any of (1) to (4), wherein the demodulator does not include transfer gates and wherein the at least one storage node is directly connected to the pinned photodiode.

(6) The demodulator of any one of (1) to (5), wherein the semiconductor region is a first well.

(7) The demodulator of any one of (1) to (6), wherein a lower junction and at least one lateral junction substantially perpendicular to the lower junction are formed at the interface of the semiconductor region with the epitaxial semiconductor layer and wherein the demodulator further includes generating unit configured to generate minority and majority carriers at said lateral junction and for forming a lateral photodiode.

(8) The demodulator of (7), wherein the generating unit includes at least one second well of the first conductivity type (p, n) formed within the epitaxial semiconductor layer and wherein the at least one transfer gate and storage node are formed within said at least second well, the second well contacting the semiconductor region.

(9) The demodulator of (8), wherein the doping of the epitaxial semiconductor layer and the doping of said second well are adapted for forming at least one depletion area extending laterally within the epitaxial semiconductor layer.

(10) The demodulator of any of (7) to (9), wherein the semiconductor layer includes a boundary and wherein the demodulator further includes a semiconductor implant doped with a fourth dopant (p+, n+) of the first conductivity type formed on top of said semiconductor layer, disposed along said boundary, for forming a lateral PIN photodiode.

(11) The demodulator of (9) or (10), wherein the semiconductor region and the pinning layer extend laterally for increasing the surface of the depletion area.

(12) The demodulator of (11), wherein the semiconductor region and pinning layer form a plurality of tentacles laterally extending and tapering outwardly from a central region of the pinning layer towards said boundary.

(13) The demodulator of any one of (1) to (12) for use in Time-Of-Flight applications.

(14) A method for operating the demodulator of any one of (1) to (4) and (6) to (13), including the steps of:
  associating each separate region of the pinning layer with a transfer gate;
  driving at least one of the separate regions of the pinning layer with a demodulation signal; and
  driving the associated transfer gate with one of a Direct Current signal and said demodulation signal.

(15) The method of (14) for use in Time-Of-Flight applications, wherein the demodulator includes two separate regions and two transfer gates, the method including the steps of:
  driving a first association of a separate region and a transfer gate with a first demodulation signal;
  driving a second association of another separate region and another transfer gate with a second demodulation signal, said second demodulation signal being in counter-phase with said first demodulation signal.

The invention claimed is:

1. A pinned photodiode comprising:
   an epitaxial semiconductor layer doped with a first dopant of a first conductivity type;
   a semiconductor region doped with a second dopant of a second conductivity type opposite to the first conductivity type, formed within the epitaxial semiconductor layer; and
   a pinning layer highly doped with a third dopant of the first conductivity type formed on top of the semiconductor region, the pinning layer being split into at least two separate regions spaced apart by electrical insulating element, each region arranged for being biased independently by a respective biasing signal for creating a gradient of potential within the semiconductor region.

2. The pinned photodiode of claim 1, wherein the electrical insulating element comprises a shallow trench isolation.

3. The pinned photodiode of claim 1, wherein at least one of the biasing signals is a demodulation signal.

4. The pinned photodiode of claim 1, wherein the semiconductor region is a well.

5. The pinned photodiode of claim 1, wherein a lower junction and at least one lateral junction substantially perpendicular to the lower junction are formed at an interface of the semiconductor region with the epitaxial semiconductor layer.

6. A demodulator comprising:
   a pinned photodiode;
   at least one storage node; and
   at least one transfer gate connected between the at least one storage node and the pinned photodiode, wherein the pinned photodiode comprises:
       an epitaxial semiconductor layer doped with a first dopant of a first conductivity type;
       a semiconductor region doped with a second dopant of a second conductivity type opposite to the first conductivity type, formed within the epitaxial semiconductor layer; and
       a pinning layer highly doped with a third dopant of the first conductivity type formed on top of the semiconductor region, the pinning layer being split into at least two separate regions spaced apart by electrical insulating element, each region arranged for being biased independently by a respective biasing signal for creating a gradient of potential within the semiconductor region.

7. The demodulator of claim 6, wherein the electrical insulating element comprises a shallow trench isolation.

8. The demodulator of claim 6, wherein at least one of the biasing signals is a demodulation signal.

9. The demodulator of claim 6, wherein a lower junction and at least one lateral junction substantially perpendicular to the lower junction are formed at an interface of the semiconductor region with the epitaxial semiconductor layer and wherein the demodulator further comprises a generating unit configured to generate minority and majority carriers at said lateral junction and for forming a lateral photodiode.

10. The demodulator of claim 9, wherein the generating unit comprises at least one well of the first conductivity type formed within the epitaxial semiconductor layer and wherein the at least one transfer gate and the at least one storage node are formed within said at least well, the at least one well contacting the semiconductor region.

11. The demodulator of claim 10, wherein the doping of the epitaxial semiconductor layer and the doping of said at least one well are adapted for forming at least one depletion area extending laterally within the epitaxial semiconductor layer.

12. The demodulator of claim 9, wherein the semiconductor layer comprises a boundary and wherein the demodulator further comprises a semiconductor implant doped with a fourth dopant of the first conductivity type formed on top of said semiconductor layer, disposed along said boundary, for forming a lateral PIN photodiode.

13. The demodulator of claim 12, wherein the semiconductor region and the pinning layer extend laterally for increasing the surface of the depletion area.

14. The demodulator of claim 13, wherein the semiconductor region and the pinning layer form a plurality of tentacles laterally extending and tapering outwardly from a central region of the pinning layer toward said boundary.

15. A method for operating the demodulator of claim 6, the method comprising:
   associating each separate region of the pinning layer with a transfer gate;
   driving at least one of the separate regions of the pinning layer with a demodulation signal; and
   driving the associated transfer gate with one of a direct current signal and said demodulation signal.

16. The method of claim 15 for use in Time-Of-Flight applications, wherein the demodulator comprises two separate regions and two transfer gates, the method further comprising:
   driving a first association of a separate region and a transfer gate with a first demodulation signal; and
   driving a second association of another separate region and another transfer gate with a second demodulation signal, said second demodulation signal being in counter-phase with said first demodulation signal.

* * * * *